United States Patent
Simon

(10) Patent No.: US 8,107,209 B2
(45) Date of Patent: Jan. 31, 2012

(54) PROTECTION CIRCUIT

(75) Inventor: Karoly Simon, Landskrona (SE)

(73) Assignee: Sony Ericsson Mobile Communications AB, Lund (SE)

( * ) Notice: Subject to any disclaimer, the term of this patent is extended or adjusted under 35 U.S.C. 154(b) by 790 days.

(21) Appl. No.: 12/185,958

(22) Filed: Aug. 5, 2008

(65) Prior Publication Data

US 2010/0033883 A1 Feb. 11, 2010

(51) Int. Cl.
*H02H 9/00* (2006.01)
*H02H 3/00* (2006.01)
(52) U.S. Cl. .......................... 361/119; 361/42
(58) Field of Classification Search .............. 361/119, 361/42
See application file for complete search history.

(56) References Cited

U.S. PATENT DOCUMENTS

| 3,686,530 A | 8/1972 | Bogut |
| 5,162,965 A * | 11/1992 | Milberger et al. ............... 361/56 |
| 5,559,500 A | 9/1996 | Kase |
| 7,056,179 B2 * | 6/2006 | Courtney ........................ 441/90 |
| 2007/0139844 A1 | 6/2007 | Horey et al. |

FOREIGN PATENT DOCUMENTS

JP 2001-037244 A 2/2001

OTHER PUBLICATIONS

Patent Cooperation Treaty International Search Report and Written Opinion of the International Searching Authority corresponding to PCT/EP2009/051169 dated Jun. 25, 2009, 9 pages.

* cited by examiner

*Primary Examiner* — Stephen W Jackson
(74) *Attorney, Agent, or Firm* — Harrity & Harrity, LLP

(57) ABSTRACT

A method and an arrangement to detect and protect an electrical device against short-circuiting due to a presence of a conductive subject are provided. The arrangement may include a first and second probe, the first probe connecting to an electrical ground and the second probe connecting to a detecting device, the detecting device being configured to detect a short-circuit between the first and second probes, and output a signal to interrupt power supply from a power source to electrical components of the electrical device.

11 Claims, 5 Drawing Sheets

PROTECTION CIRCUIT

TECHNICAL FIELD

The present invention relates generally to a method and device for protecting electrical parts of an electrical device and, more particularly, protecting the device against short circuiting.

BACKGROUND

Communication devices, such as cellular telephones, have become increasingly versatile. For example, cellular telephones today often include applications that allow users to do more than just make and receive telephone calls, such as send/receive text messages, play music, play video games, take pictures, etc. As a result, cellular telephones have become an increasingly common part of every day life for a large number of users.

Becoming a common part of every day life means that the cell phone is carried around in and subjected to different temperature and moisture environments, e.g., high humidity, water, and other liquids. For example, the cell phone may be exposed to heavy rain or submersed in water. The housing of the cell phone usually will not protect against such elements and water will inevitably penetrate the housing. That is, mobile phone housing are not impervious to water, i.e., not watertight.

High level of moisture, high humidity, or conductive liquids inside an electronic device may cause short circuiting, which may cause performance degradation and result in permanent damage and/or destroy the device and, in worse case, injure the user.

SUMMARY

Thus, a need exists for an arrangement to protect electrical devices against short circuiting due to high level of moisture, high humidity, or conductive fluids inside the device.

Embodiments of the invention provide a method for detecting and protecting an electrical device against short circuit due to presence of a conductive subject. The method may include using a first and second probe, the first probe being connected to ground and the second probe being connected to a detecting device, detecting a short circuit between the first and second probes, and controlling a switching element to interrupt power supply from a power source to one or several of electrical components of the electrical device.

Embodiments of the invention also relate to an arrangement for detecting and protecting an electrical device against short circuit due to presence of a conductive subject. The arrangement may include a first and second probe, the first probe being connected to ground and the second probe being connected to a detecting device, the detecting device being configured to detect a short circuit between the first and second probes, and output a signal to interrupt power supply from a power source to one or several of electrical components of the electrical device. For example, the probes may be arranged on a carrying structure for carrying electrical components of the device. Advantageously, the probes may be arranged as loops. The carrying structure may be a PCB. In one embodiment, the switching element may be a transistor and the power source a battery. For example, a distance between the probes may be sufficient to detect presence of the conductive subject. The probes may be located close to a specific place and/or component. According to one embodiment, several probes may be arranged in parallel for concurrent detection at different places.

Embodiments of the invention also relate to a mobile communication terminal including an antenna for receiving/transmitting RF signals as between the terminal and a cell site antenna of a wireless/cellular telecommunications network, a transceiver associated with the antenna for processing incoming and outgoing signals, call processing components for controlling operation of the terminal, and user interface components for providing an interface between the terminal and a user. The mobile communication terminal may further include an arrangement for detecting and protecting the terminal against short circuit due to presence of a conductive subject. The arrangement may include a first and second probe, the first probe being connected to ground and the second probe being connected to a detecting device, the detecting device being configured to detect a short circuit between the first and second probes, and output a signal to interrupt power supply from a power source to one or several of electrical components of the mobile communication terminal.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

A "device," as the term is used herein, is to be broadly interpreted to include any electrical device, such as portable, communication device, which may be susceptible to being exposed to a short-circuiting medium; such a device may include: a personal communications system (PCS) terminal that may combine a cellular radiotelephone with data processing; a personal digital assistant (PDA) that can include a radiotelephone, pager, Internet/intranet access device, web browser, an organizer, a calendar, a camera (e.g., video and/or still image camera), a sound recorder, and/or a global positioning system (GPS) receiver; a GPS device; a sound recorder; and any other computation and/or communication device capable of displaying media, etc In the following, the invention is described in an exemplary way with reference to a wireless communication terminal, such as a cell phone.

Figure 1:
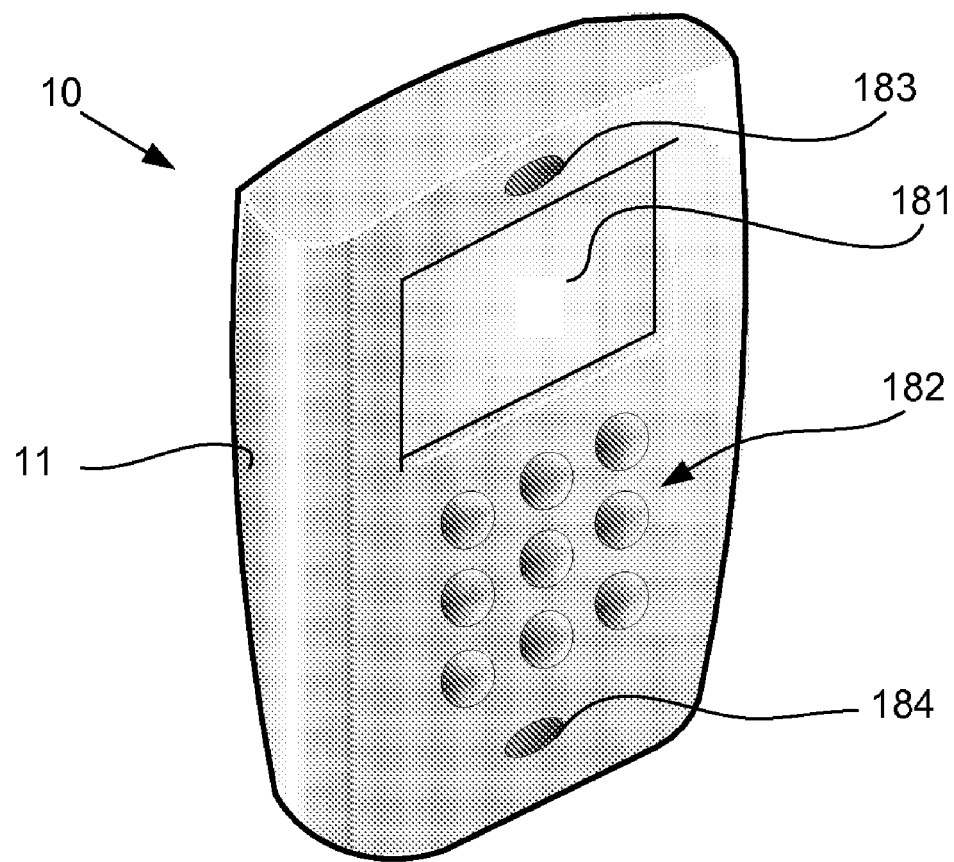
FIG. 1 is a perspective view of a portable telephone in connection with which the present invention can be used.
Figure 2:
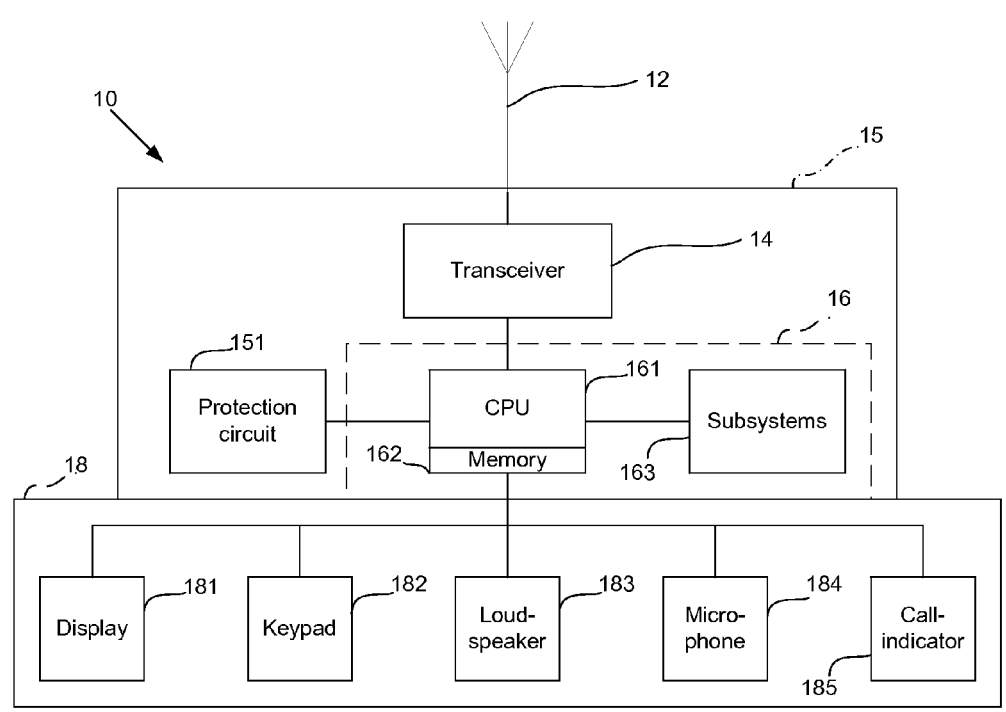
FIG. 2 is a schematic diagram of a portable telephone system in accordance with the present invention.

Referring now to FIGS. 1 and 2, a mobile communication terminal system or handset (cell phone) 10 is illustrated. Generally, handset 10 may include a hosing 11 including an antenna 12 for receiving/transmitting RF signals as between the handset 10 and a cell site antenna of a wireless/cellular telecommunications network; transceiver 14 associated with antenna 12 for processing incoming and outgoing signals, call processing components 16 for controlling operation of handset 10, and user interface components 18 for providing an interface between handset 10 and the user. Transceiver 14 and processing components 16 may be arranged on a carrying structure such as a printed circuit board (PCB) 15.

Transceiver 14 may include an incoming signal processing unit and an outgoing call processing unit (not shown). The incoming signal processing unit may perform a number of functions relative to an incoming call signal including filtering the incoming signal to remove unnecessary wavelength bands, demodulating the high frequency carrier signal and converting the signal into a digital format for processing by call processing component 16. Outgoing call processing unit 16 may perform a number of functions relative to transmitting a signal including processing a voice or other signal for transmission, synthesizing the communication signal to apply a reference frequency, modulating the communication signal into a high frequency carrier signal, and/or filtering the resulting signal for transmission.

Call processing components 16 may include a processor (CPU) 161 and a memory 162, and a subsystem 163, including, for example, a timing subsystem, a call indicator control subsystem, messaging subsystem and I/O units. Processor 161 may control operation of the various components of handset 10. In this regard, processor 161 may receive an incoming signal from the incoming signal processing unit, and notify the subscriber of the incoming call. Processor 161 may communicate with cell site/switch equipment via outgoing call processing unit 16 and antenna 12 to establish a channel for communication as between handset 10 and a calling telephone that originated the incoming call signal. With respect to outgoing calls, processor 161 may receive information from user interface components 18, e.g., a phone number and transmit signal, communicate with cell site/switch equipment via transceiver 14 and antenna 12 to establish a communications channel, transmit a call request and wait for a response from the called telephone/network. During a phone conversation, processor 161 may receive voice communications from user interface components 18, transmit the voice communications, receive incoming signals, transmit voice communications to user interface components 18, and detect any operating signals, such as a hang up signal.

User interface components 18 may include a number of devices for communicating with the subscriber. A display 181 may provide a visual presentation of a phone number entered by the user, information regarding an incoming call and/or various operating information such as status of the battery of handset 10. A keypad 182 may include buttons corresponding, for example, to the numbers 0-9, for entering phone numbers and/or other numerical information as well as various other buttons such as "end", "off", "#", "*", "flash", "send", or other buttons. An ear piece 183 or a loudspeaker may receive communication information from processor 161 and provide audio signals to the subscriber. A microphone 184 may receive voice or other audio signals from the subscriber and provide corresponding communication signals to processor 161. Finally, a call indicator 185 may provide a signal to the subscriber that may notify the subscriber of an incoming call. For example, call indicator 185 may be a ringer or other device for providing an audio indication, a vibrator, or any other device which provides a signal that is perceptible by the subscriber.

Handset 10, according to an embodiment of the present invention, may further include a protection unit, which may include a sensor portion and control circuitry.

Figure 3:
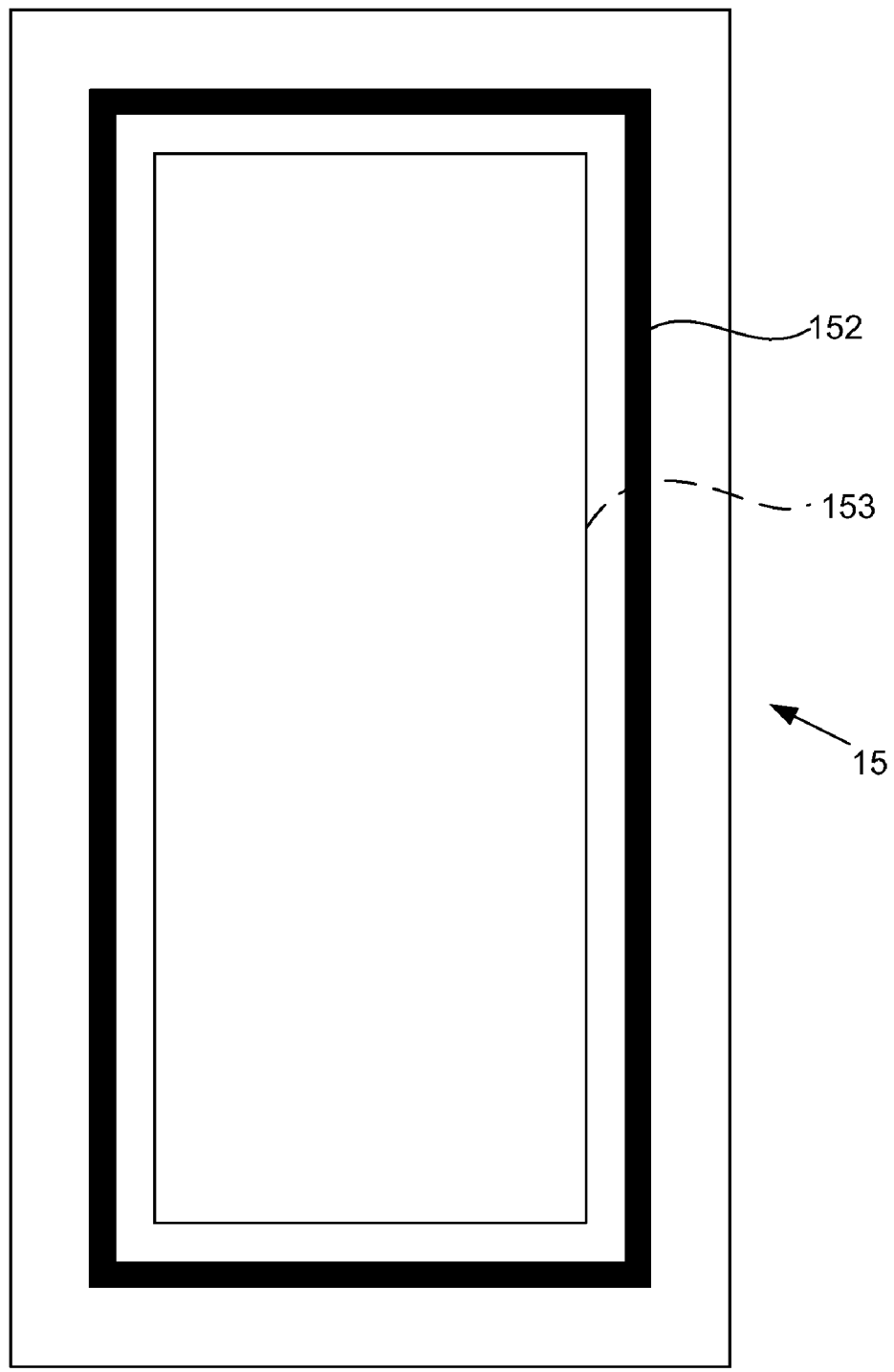
FIG. 3 is a schematic top view of a PCB comprising a sensor according to the present invention.

FIG. 3 illustrates a top view of a substrate structure, PCB 15, for supporting some or parts of electrical components of handset 10. PCB 15, in one or several layers, may include conductors (e.g., bus traces (not shown)) coupling the components (not shown) together. PCB 15 may be provided with a ground loop 152, for example, which may surround PCB 15. A second loop (sensor loop) of a conductive material may be arranged, for example, inside ground loop 152. The second loop may be configured as a sensor loop and will be referred to as sensor loop 153 in the following. Ground loop 152 and sensor loop 153 may function as probes. Sensor loop 153 can readily be made of a copper or any other conductive material wire trace around PCB 15. Both ground loop 152 and sensor loop 153 may be disposed in specific locations surrounding the electrical parts.

The probes may have any regular and/or irregular shape. The probes do not need to be formed as loops. However, the distance between the two probes may be a predetermined (small) distance, constant and/or varying at select points along the paths, i.e., the loops need not be concentric. One or more of the probes can be also disposed proximate a specific location(s) and/or component(s), for example, based on a determined susceptibility of a particular area to water moisture exposure. One or more other pairs of probes may be arranged in parallel so that is possible to detect short-circuiting conditions at different places at the same time.

Figure 4:
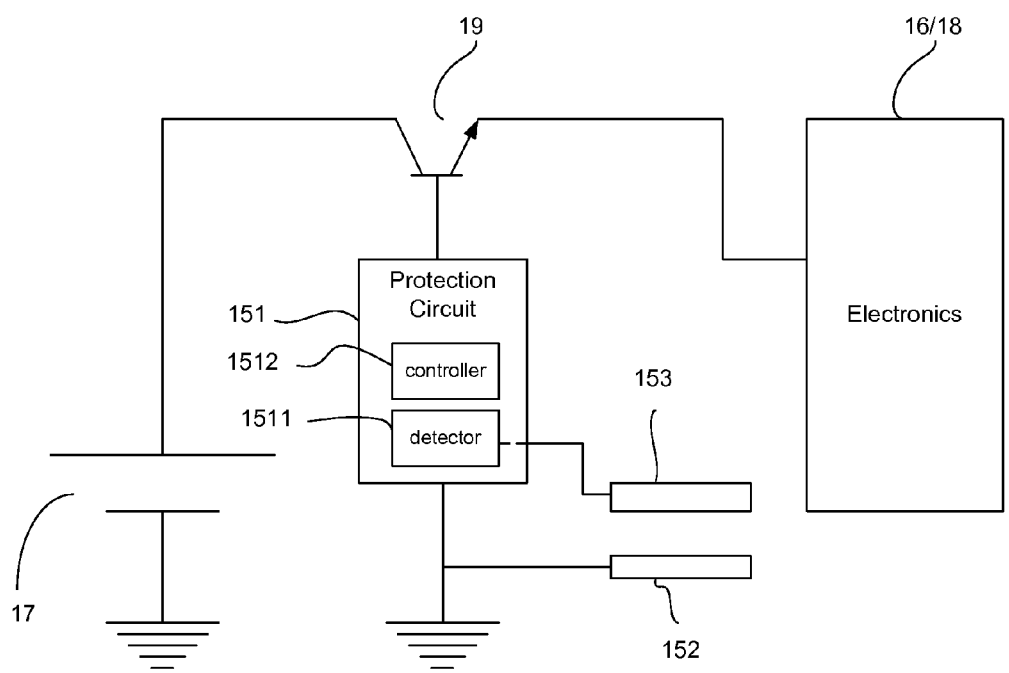
FIG. 4 is a schematic diagram of a protection system in accordance with the present invention.

FIG. 4 illustrates a block diagram of a protection arrangement according to one embodiment of the invention in handset 10, including a power source or battery 17, a switching element 19, a protection circuit 151, ground probe 152, sensor probe 153 (collectively, probes 152 and 153), processing unit 16, and electronics 18, as mentioned above. Switching element 19 is represented by an NPN transistor, but may include other types of switching elements and other types of transistors. Protection circuit 151 may include a detection portion 1511 and a control portion 1512. Detection portion 1511 may detect a voltage fall and/or current rush or surge between probes 152 and 153. Controlling portion 1512 may control switching element 19 directly and/or by outputting a signal indicating a state of short-circuiting to, for example, CPU 161, which may control switching element 19.

In one embodiment, when handset 10 detects the presence of a foreign substance in the form of a conductive medium which can potentially short-circuit the electrical components near the electronics, handset 10 may, based on a detected short-circuiting state, disable the power from the power source, e.g., battery 17, from select electrical components to avoid a short-circuit in one or more of the components (e.g., components determined to be particularly susceptible to adverse effects from power surges), for example, in an area of the detected conductive media (i.e., selective limited-area (i.e., localized) power disruption). The power source may, besides battery 17, include an output from a power adapter, a capacitor, etc. In the following, the invention is described with reference to battery 17 as the power source.

Battery 17, at a positive terminal, may connect to a collector terminal of transistor 19, which may be controlled by protection circuit 151 at its base terminal and connected to the (main) electronics at its emitter terminal. Protection circuit 151 may connect to sensor probe 153, and may connect to ground probe 152 directly, or indirectly through common grounding.

Basically, the current from battery 17 may run through transistor 19 before supplying the one or more electronic components with power. Transistor 19 may be controlled, i.e., switches off and on power, by protection circuit 151 that uses (dedicated) sensor probes to monitor whether a conductive media, such as high humidity, water, and/or any other conductive liquid, is present in handset 10, for example, above a predetermined threshold value, that may potentially lead to short-circuiting conditions within headset 10.

Sensor probe 153 can readily be formed, for example, from a conductive wire trace (copper, gold, etc.) around PCB 15, for example, as shown in FIG. 3. When water, for example, is present in handset 10, then the water may short-circuit the sensor trace (sensor probe 153) to ground (via ground probe 152), which may be detected by protection circuit 151, which may control transistor 19 to disconnect battery 17.

Figure 5:
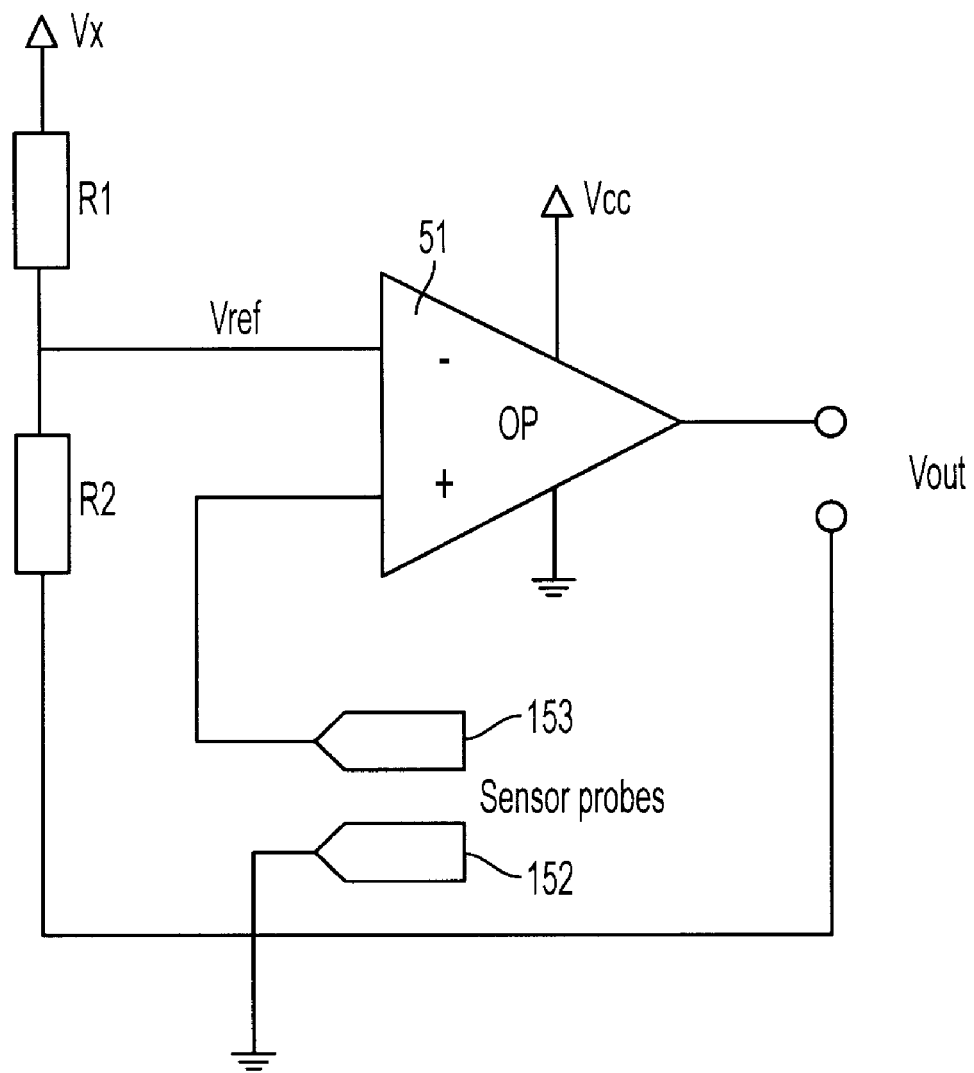
FIG. 5 is a schematic diagram of a short circuit detection circuit in accordance with the present invention.

FIG. 5 illustrates a simple detecting circuit 50 for detecting short-circuiting. Detecting circuit 50 may include an operation amplifier (OP) 51 connected to sensor probe 153 at its non inverting input (+). As long as probes 152 and 152 are not short-circuited, the output of the OP may be high. When short-circuited between probes 152 and 153, the output of the OP may go low, which may generate a signal to break (or control) switching element 19, mentioned above, to interrupt the power supply to electronics of handset 10 via a controller circuit, for example, select components based on a determined electrical sensitivity associated with a particular component.

The level of a reference voltage ($V_{ref}$) connected to the inverting input (−) of OP 51 may be set to a predetermined level to avoid a false triggering (e.g., due to levels of moisture that may not cause degradation of electronic components). This may be done, for example, using R1/R2. $V_x$ may connect through R1 and be a regulated reference voltage of good quality. In one embodiment, a user of handset 10 may select the sensitivity level of protection circuit 151, based on, for example, operation of handset 10 within a particular climate (e.g., rainy Pacific Northwest, arid desert Southwest U.S.), transient atmospheric conditions, and/or other adverse operating environments. That is, handset 10 may include settings corresponding to incremental levels of preset protection sensitivity for selection by the user. The particular detection configuration is shown as an example and many other types of detection devices may be used.

According to one embodiment of the invention, it will not be possible to power up handset 10 again unless battery 17 has been removed and replaced. However, in one embodiment, protection circuit 151 may disconnect the power until all short-circuiting media are removed (e.g., sufficiently dried up).

The principles of the invention may be used for any product that may be subjected to short-circuiting due to, for example, excessive moisture, condensation, high humidity, or exposure to conductive liquids inside the housing, in and/or around sensitive electronic components.

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be implemented at least in part by means of both hardware and software, and that several "means", "units" or "devices" may be represented by the same item of hardware.

The above mentioned and described embodiments are only given as examples and should not be limiting to the present invention. Other solutions, uses, objectives, and functions within the scope of the invention as claimed in the below described patent claims should be apparent for the person skilled in the art.

What we claim is:

1. A method of detecting a potential short-circuit condition due to a presence of a conductive media in an electrical device, the method comprising:
    detecting a short-circuit between a first sensor and a second sensor in the electrical device, the first sensor being connected to ground in the electrical device and the second sensor being connected to a detecting device in the electrical device, where said first and second sensors surround one or several electrical components; and
    controlling, based on the detecting, a switching element in the electrical device to interrupt a power supply from a power source to the one or several of the electrical components in the electrical device.

2. An arrangement for a detecting presence of a conductive substance in a electrical device, the arrangement comprising:
    a power source to connect to a plurality of electronic components of the electrical device;
    a first sensor connected to a ground of the electrical device; and
    a second sensor connected to a detecting device of the electrical device, where said first and second sensors surround one or several of the plurality of electrical components,
    wherein the detecting device is configured to detect a short-circuit condition between the first and second sensors and output a signal to interrupt a power supply from the power source to the one or several of the plurality of electronic components.

3. The arrangement of claim 2, wherein the first sensor and the second sensor are configured as loops.

4. The arrangement of claim 2, wherein the first sensor and the second sensor are arranged on a carrying structure for carrying the plurality of electrical components of the electrical device.

5. The arrangement of claim 4, wherein the carrying arrangement comprises a printed circuit board.

6. The arrangement of claim 2, wherein the plurality of electrical components include a switching element to interrupt the power supply, and the switching element comprises a transistor.

7. The arrangement of claim 2, wherein the power source comprises a battery.

8. The arrangement of claim 2, wherein a distance between the first and second sensors is set to detect the presence of the conductive substance.

9. The arrangement of claim 2, wherein the sensors are located proximate at least one of a determined location or a particular one of the one or several of the plurality of electrical components.

10. The arrangement of claim 2, further comprising a third sensor and a fourth sensor, configured in parallel to the first and second sensors, to concurrently detect another shortcircuit at a different location within the electrical device.

11. An electrical device comprising an antenna for receiving/transmitting RF signals between the terminal and a cell site antenna of a wireless/cellular telecommunications network, a transceiver associated with the antenna for processing incoming and outgoing signals, call processing components for controlling operation of the terminal, and user interface components for providing an interface between the terminal and a user, the electrical device further comprising an arrangement for detecting and protecting the electrical device from shortcircuiting due to a presence of a conductive media, the arrangement comprising:
    a first sensor connected to ground of said electrical device;
    a second sensor connected to a detecting device;
    said first and second sensors surrounding one or several electrical components of the electrical device, and
    wherein the detecting device is configured to detect a short circuit between the first and second sensors, and output a signal to interrupt a power supply from a power source to the one or several of the electrical components of the electrical device.

* * * * *